United States Patent [19]
Bell

[11] Patent Number: 4,879,524
[45] Date of Patent: Nov. 7, 1989

[54] CONSTANT CURRENT DRIVE CIRCUIT WITH REDUCED TRANSIENT RECOVERY TIME

[75] Inventor: Kenneth M. Bell, Windom, Tex.
[73] Assignee: Texas Instruments Incorporated, Dallas, Tex.
[21] Appl. No.: 234,987
[22] Filed: Aug. 22, 1988
[51] Int. Cl.$^4$ .............................................. H03F 3/26
[52] U.S. Cl. .................................... 330/288; 330/263; 330/264
[58] Field of Search ............... 330/263, 264, 288, 311; 323/315, 316

[56] References Cited

U.S. PATENT DOCUMENTS 4,591,804  5/1986  van Tuijl ............................ 330/288

OTHER PUBLICATIONS

Gray & Meyer, *Analysis and Design of Analog Integrated Circuits*, Second Edition, John Wiley & Sons, 1984, pp. 234, 242 and 245.

*Primary Examiner*—Steven Mottola
*Attorney, Agent, or Firm*—B. Peter Barndt

[57] ABSTRACT

One of the input and output terminals of a current amplifier is coupled via a threshold conduction device to a drive circuit input terminal and the other of the input and output terminals is coupled via the conduction path of an output transistor to an output terminal of the drive circuit. A further amplifier, coupled to the threshold conduction device, provides a low impedance drive signal for the control electrode of the output transistor for biasing the output transistor to produce an output current proportional to an input current applied to the drive circuit input terminal and for enhancing the transient recovery time of the drive circuit for abrupt changes in output voltage at the output terminal.

22 Claims, 4 Drawing Sheets

CONSTANT CURRENT DRIVE CIRCUIT WITH REDUCED TRANSIENT RECOVERY TIME

FIELD OF THE INVENTION

This invention relates to current drive circuits and particularly to circuits for providing output current to a load which is substantially constant and independent of variations in load voltage.

BACKGROUND OF THE INVENTION

The uses of constant current drive circuits are well known. A chief requirement of an "ideal" constant current circuit, by definition, is that the output current produced by the circuit should be a function only of the input current and should be unaffected by any changes in output voltage produced by the load to which the circuit is connected. Such changes in load voltage may occur, for example, when a number of current sources or other devices are coupled to supply current to a common load. In such applications it is often desirable that one source not influence the magnitude of the current provided by another source.

Various techniques are known for producing substantially constant currents notwithstanding load voltage variations. FIG. 1 herein is an example of a known current amplifier 10 (commonly called a "current mirror" amplifier) which provides a moderately constant output current. The circuit includes a "diode-connected" NPN input transistor N1 having a conduction path coupled between an input terminal 1 to which an input current is applied and a common terminal 3 to which a reference or supply voltage V1 is applied. An output NPN transistor N2, having base and emitter electrodes connected to corresponding electrodes of transistor N1, supplies an output current, I out, to an output terminal 2.

In operation, the input current flow though transistor N1 produces a base-emitter voltage which biases the output transistor to provide an output current proportional to the product of the input current and the ratio of the base-emitter junction areas of transistors N1 and N2. For a current gain greater than unity, the junction area of transistor N2 is made greater than that of transistor N1. Conversely, for a current gain less than unity (current attenuation) the junction area of transistor N2 is made less than that of transistor N1. Because of the "early effect" (i.e., base width modulation with collector to base voltage variations), the output current of transistor N2 will vary somewhat with changes in output voltage at terminal 2 produced by the load (not shown) to which the current amplifier circuit 10 is connected. The undesirable sensitivity of the circuit output current to load voltage variations may be reduced to a substantial extent by the known circuit techniques illustrated in FIGS. 2 and 3.

In FIG. 2 an output transistor N4 is connected in cascode with the current mirror amplifier 10 output transistor N2 thereby minimizing the "early effect" by maintaining the collector voltage of transistor N2 at a relatively constant value. This is implemented, as shown, by connecting a diode-connected NPN transistor N3 between a circuit input terminal 4 and the input 1 of current amplifier 10 to generate an offset voltage of 2 Vbe at terminal 4. The offset voltage is applied to the base of NPN transistor N4 having its collector and emitter electrodes connected, respectively, to a circuit output terminal 5 and to the output 2 of current amplifier 10. Thus biased, transistor N4 regulates the collector to emitter voltage of transistor N2 of current amplifier 10 at a relatively constant value of 1-Vbe notwithstanding load voltage variations appearing at the circuit output terminal 5.

In FIG. 3 negative feedback is used for providing suppression of the "early effect" and to improve the output current stability of the current amplifier 10. The example of FIG. 3 differs from that of FIG. 2 in two respects, namely, (i) the connections of terminals 1 and 2 of current amplifier 10 are interchanged and (ii) the junction area ratios of transistors N1 and N2 are reversed (i.e., for a current gain, the junction area of transistor N1 is made larger than that of transistor N2). In operation, the collector emitter voltage of transistor N2 is equal to the sum of the base-emitter voltages of transistors N1 and N4 less that of transistor N3 and therefore is of a relatively constant value notwithstanding load voltage variations at circuit output terminal 5. Feedback regulation results because a tendency for the output current to increase above a value determined by the input current and the base-emitter junction area ratio will cause an increase in voltage across transistor N1. This, in turn, will cause increased conduction through transistor N2 which will reduce the base drive of the output transistor N4 thereby counteracting the assumed increase in the output current.

SUMMARY OF THE INVENTION

The present invention resides, in part, in the discovery of a heretofore unrecognized problem which can occur under certain operating conditions of the aforementioned current source circuits. Specifically, it has been discovered that abrupt changes in load voltage can result in substantial transient changes in output current and the output current transients can require considerable recovery time to return to a steady state value.

The dashed waveform of FIG. 6 herein illustrates the severity of the transient problem for the prior art constant current source of FIG. 2 for the condition of a 5 to 15 volt low-to-high transition of output voltage with a rise-time of 5 nanoseconds and an assumed circuit current gain (transistor area ratio) of 5:1. As seen, the output current change is substantially greater than a factor of two in both directions and the circuit requires over 40 nanoseconds to recover from the transient change. FIGS. 7, 8 and 9, discussed in detail subsequently, provide further illustration of the newly discovered problem and show the substantial improvement of (i) reduction of transient magnitude and (ii) reduction of transient recovery time provided by the present invention.

It is herein recognized that a need exists for a constant current source or circuit having reduced sensitivity to output voltage transients.

It is further herein recognized that a particular need exists for a constant current circuit which provides a reduction in both the magnitude and the recovery time of output current transients induced by abrupt output voltage changes. The present invention is directed to meeting those needs.

A constant current drive circuit embodying the invention comprises a current amplifier having a first terminal coupled via a threshold conduction device to a circuit input terminal and having a second terminal coupled via the conduction path of an output transistor to a circuit output terminal. A further amplifier is coupled to supply a voltage produced by the threshold conduction device to a control electrode of the output transistor for reducing the sensitivity of the drive circuit to abrupt changes in output voltage at said drive circuit output terminal.

In accordance with another aspect of the invention the further amplifier comprises a unity voltage gain non-inverting amplifier providing an impedance reduction between the device and the output transistor.

In accordance with another aspect of the invention the further amplifier comprises a push-pull amplifier having a pair of complementary transistors biased for continuous conduction of operating current through their respective conduction paths.

In accordance with a further aspect of the invention the threshold conduction device comprises a first pair of complementary transistors and the further amplifier comprises a second pair of complementary transistors having conduction paths biased for continuous conduction of operating current by the first pair of complementary transistors.

BRIEF DESCRIPTION OF THE DRAWING

The foregoing and further aspects of the invention are illustrated in the accompanying drawing wherein like elements are denoted by like reference designators and in which.

DETAILED DESCRIPTION

Figure 1:
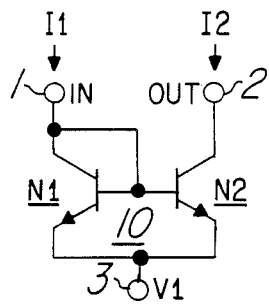
FIG. 1 is a circuit diagram of a known current drive circuit (current mirror amplifier) which is relatively sensitive to output voltage changes.
Figure 2:
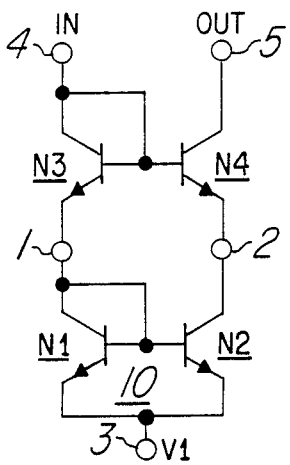
FIGS. 2 and 3 are circuit diagrams illustrating known modifications of the current amplifier of FIG. 1 for reducing the sensitivity of the amplifier to output voltage changes.
Figure 3:
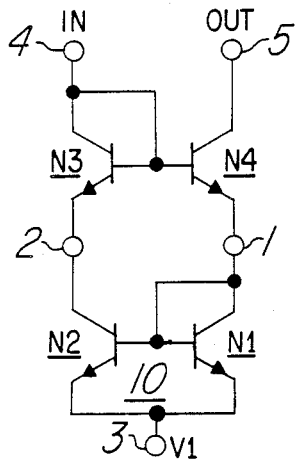

The conventional current mirror amplifier of FIG. 1 and the known circuits of FIGS. 2 and 3 for providing reduced sensitivity to output voltage changes have been previously discussed. As was explained, the known circuit techniques are effective for steady-state or relatively slowly changing circuit conditions but "abrupt" output voltage changes produce large output current transients which take considerable time to settle or return to a quiescent value.

Figure 6:
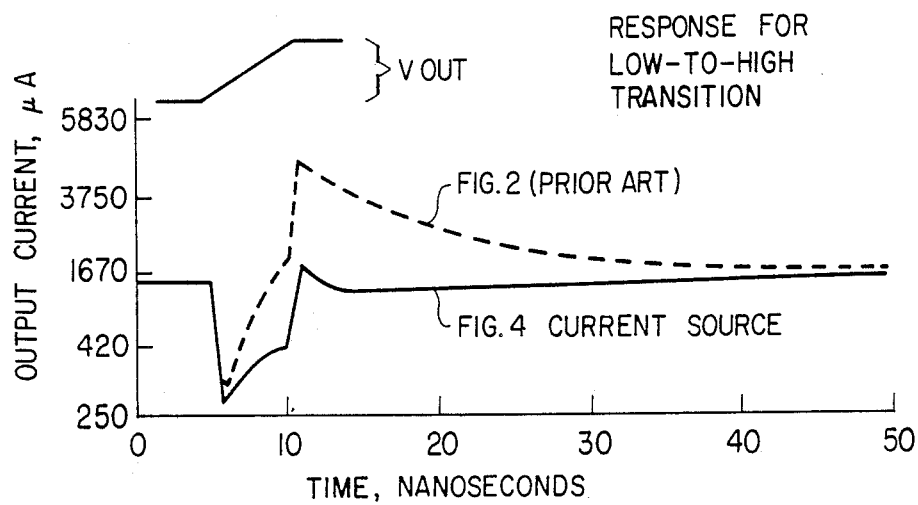
FIGS. 6 and 7 are waveform diagrams illustrating the improvement in transient response for abrupt low-to-high and high-to-low output voltage changes, respectively, for the current drive circuit of FIG. 4 as compared with the circuit of FIG. 2.
Figure 7:
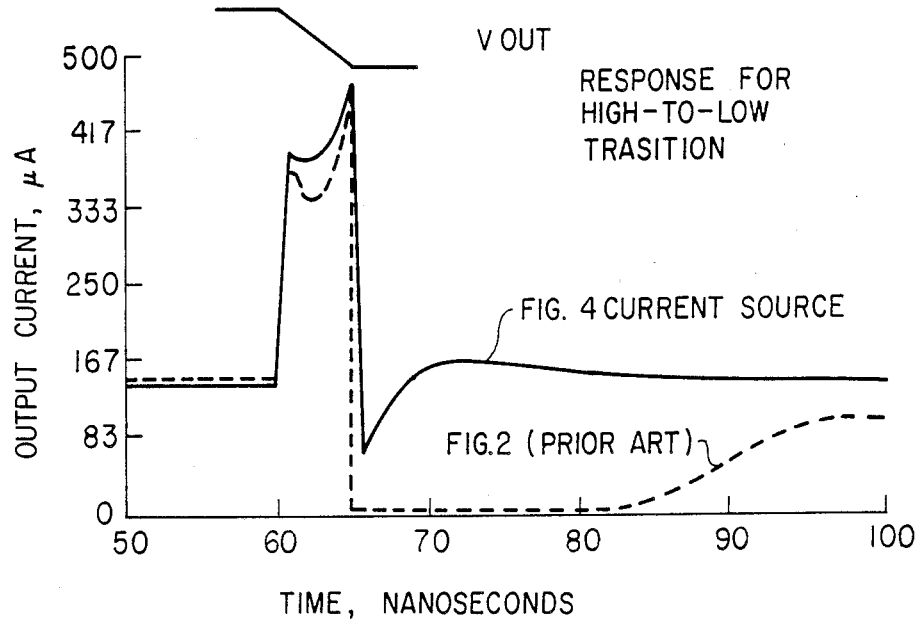

The term "abrupt", as used herein, refers to voltage changes which take place in less than a microsecond. As previously explained the response of the circuit of FIG. 2 shown in FIG. 6 (dashed waveform) is based an output voltage change occurring in about 5 nanoseconds (5 to 15 volt low-to-high output voltage transition). The reason such "abrupt" changes disturb the output current of the known circuits is believed to be caused by the combined effects of (1) the collector-to-base capacitance of the output transistor N4 and (2) the relatively high impedance of internal nodes of the current driver circuit. In FIG. 2, for example, a voltage transient at output terminal 5 will be coupled by the collector-to-base capacitance of output transistor N4 to the input terminal 1 of amplifier 10 via the base-emitter path of transistor N3 thereby momentarily changing the output current of amplifier 10. Considerable time may be required for the collector-to-base capacitance of transistor N2 to charge to a steady-state value as shown in FIGS. 6 and 7 (dashed waveforms).

Figure 8:
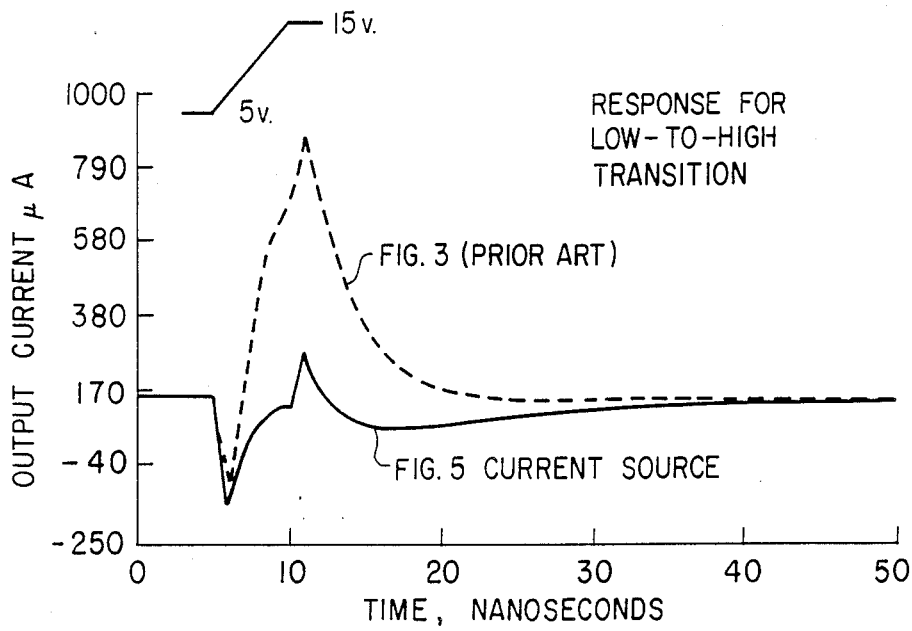
FIGS. 8 and 9 are waveform diagrams illustrating the improvement in transient response for abrupt low-to-high and high-to-low output voltage changes, respectively, for the current drive circuit of FIG. 5 as compared with the circuit of FIG. 3.
Figure 9:
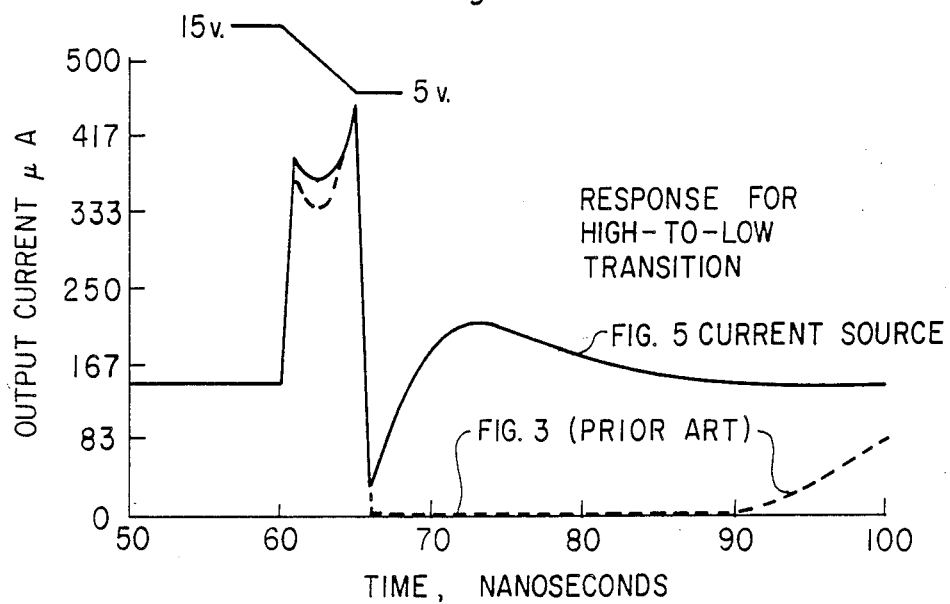

The response of the FIG. 3 circuit to abrupt output voltage changes is also believed to be due to collector-to-base capacitance coupling of output transistor N4 but, as shown in FIGS 8 and 9 (dashed waveform), the circuit response is substantially worse than that of the FIG. 2 circuit. It is believed that relatively poor response of the FIG. 3 circuit may be a result of amplification of the transient in the current driver feedback circuit which tends to both increase the magnitude of the transient and to lengthen the circuit recovery time under transient conditions. Advantageously, as will be seen, the principles of the present invention apply equally as well to both feedback regulated current sources (FIG. 3) and to "feedforward" (non-feedback) regulated current sources (FIG. 2).

Figure 4:
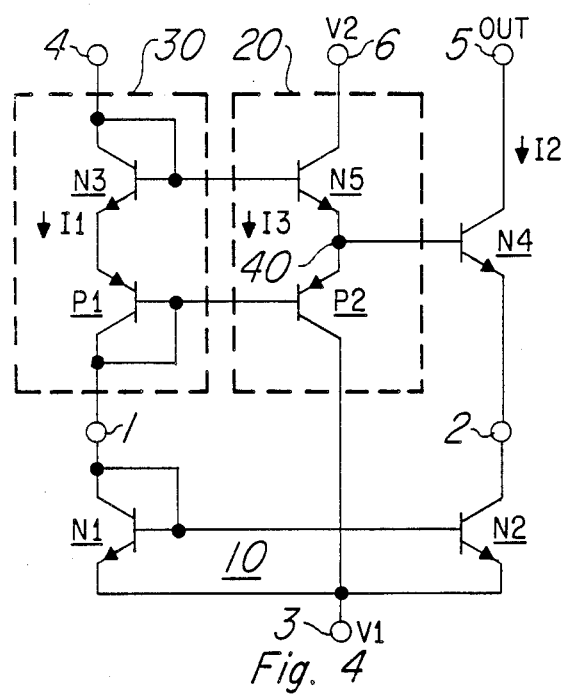
FIGS. 4 and 5 are circuit diagrams of current drive circuits embodying the invention having reduced sensitivity to abrupt output voltage changes.

FIG. 4, embodying the invention, is a modification of the current driver circuit of FIG. 2 in which transient output current changes caused by abrupt changes in output voltage at output terminal 5 are minimized by the addition of an amplifier 20 (outlined in phantom) and a threshold conduction device 30. Amplifier 20 comprises a pair of complementary NPN and PNP transistors (N5 and P2) having emitter electrodes connected to the base of output transistor N4 and having respective base electrodes connected to terminals 4 and 1, respectively. The collector electrode of transistor P2 is connected to terminal 3 for receiving supply voltage V1 and the collector electrode of transistor N5 is connected to a further supply voltage input terminal 6 for receiving a supply voltage V2 which is positive with respect to the supply voltage V1. The threshold conduction device 30 comprises NPN transistor N3 having the conduction path thereof connected in series with that of a complementary PNP transistor P1 between terminals 4 and 1. Both of transistors N3 and P1 are "diode connected" (i.e., they have collector to base feedback connections) and are poled in a sense to be forward biased by the input current I1 flowing through their conduction paths.

In operation transistors N5 and P2 of amplifier 20 are biased by transistors N3 and P1 of threshold device 30 to continuously conduct a quiescent current I3 between supply terminals 3 and 6. This ensures that node 40 (the base of output transistor N4) is driven by a very low impedance source and therefore any transient current coupled via the collector-to-base capacitance of output transistor N4 is effectively "short circuited" to one or the other of the two supply terminals 3 and 6. Stated another way, the complementary transistors P2 and N5 of amplifier 20 function as a unity gain, non-inverting, push-pull amplifier thereby providing an impedance reduction between the threshold device 30 and node 40 for suppressing transients of either polarity.

The symmetry of the amplifier 30 (complementary transistors) advantageously provides bi-directional drive capability thus ensuring that transient changes of either polarity are suppressed. If, for example, a transient tends to increase the potential of node 40 transistor P2 will conduct additional current for counteracting the increase. Conversely, a transient which tends to decrease the potential at node 40 will be counteracted by increased conduction by transistor N5. This symmetry feature is important because a change in output voltage level will always produce two opposite polarity transient effects regardless of the direction of the actual output voltage change. This is illustrated in FIG. 6 where it is seen that the prior art circuit of FIG. 2 exhibits an output current undershoot at the beginning of an output voltage transition (5 nanosecond point) and exhibits an output current overshoot at the end of the output voltage transition (10 nanosecond point). As shown in FIG. 7, the same result obtains for an opposite output voltage change except the output current overshoot precedes the undershoot.

In view of the foregoing, it is thus seen that regardless of the direction of change of the output voltage, Vo, two opposite polarity transients are produced by the prior art circuit whenever there is any rapid change in output voltage. Accordingly, it is important that amplifier 30 provide an output impedance that is low for either polarity of output current supplied to node 40. This is achieved in the example of FIG. 4 by means of complementary symmetry (i.e., the use of complementary amplifier output transistors).

A further feature of amplifier 30 that is of importance in obtaining high speed transient suppression is that the complementary transistors N5 and P2 are biased for continuous conduction of the quiescent current I3 under steady-state conditions to provide what may be termed "class-A" operation. Continuous bias ensures the highest possible reaction time of amplifier 30 to transients coupled via the collector-base capacitance of output transistor N4. This results because there is relatively little delay in supplying additional output current for a transistor which is already "turned-on" as compared to a transistor that is biased at or near cut-off.

The quiescent current I3 for amplifier 30 is controlled by input current I1 and the base-emitter junction area ratios of transistors N3, N5, P1, P2. For example, to obtain a quiescent current I3 equal to the input current I1 the junction areas of the four transistors may be made equal. Alternatively, the area of N3 could be matched to that of transistor N5 and a different area could be used for transistors P1 and P2. For a greater "idling" (quiescent) current, the junction areas of the amplifier 20 transistors may be made larger than those of the threshold conduction device 30 transistors.

Further improvement in transient suppression and recovery time may be achieved by selecting the output transistor N4 to be a "smaller" area device than the current mirror 10 output transistor N2 so as to have a relatively smaller collector-to-base junction capacity. Advantageously, if this is done then one may optionally reduce the quiescent current of amplifier 20 for suppressing transients of a given magnitude since less current will be needed to be supplied to or withdrawn from node 40.

FIGS. 6 and 7 illustrate the performance of the current driver circuit of FIG. 4 as compared with the prior art current driver circuit of FIG. 2. The data were produced by computer simulation using Gummel-Poon bipolar transistor models, selecting an input current value of 30 microamperes and selecting a junction area ratio for transistors N1 and N2 of 1:5 to establish a current gain for the driver circuit of ×5 (times five). For a driving function, a transient level change was selected corresponding to an output voltage change from 5 to 15 volts with a 5 nanosecond transition time from one level to the other.

FIG. 6 shows the comparative results for a low-to-high output voltage transition. As seen, the conventional circuit of FIG. 2 exhibited substantial undershoot and overshoot of the quiescent output current I2 and was not stabilized after 30 nanoseconds. The driver circuit of FIG. 4, embodying the invention, exhibited substantially reduced overshoot and a recovery time well under 10 nanoseconds. FIG. 7 shows the comparative results for a high-to-low output voltage transition. Here also the conventional circuit exhibited substantial overshoot and undershoot and did not stabilize within the time period shown. The driver circuit of FIG. 4, advantageously, exhibited a comparable overshoot, a greatly reduced undershoot and recovered to the quiescent level in less than 30 nanoseconds.

Figure 5:
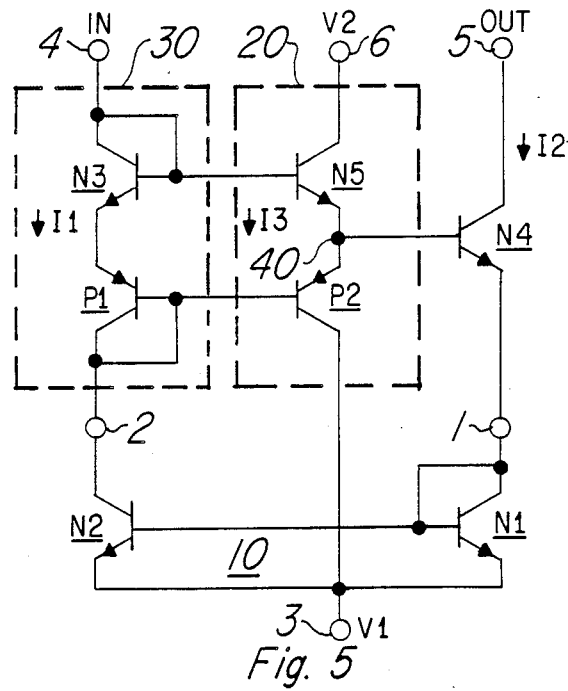

FIG. 5, embodying the invention, is a modification of the current driver circuit of FIG. 3. As previously noted, it is a feature of the present invention that the principles thereof may be applied either current drivers of the "feed-forward" type exemplified by FIG. 2 or to current drivers of the "feed-back" type as exemplified by FIG. 3. The modification of the FIG. 3 driver circuit to produce the driver circuit of FIG. 5 is substantially the same as was done to the FIG. 2 circuit to provide that of FIG. 4. Briefly, a diode-connected PNP transistor P1 is connected in series with another diode-connected transistor N3 to form the input threshold conduction device 30. This generates an offset voltage between terminals 1 and 4 equal to the sum of the base-emitter voltages of transistors N3 and P1. The offset voltage biases complementary transistors N5 and P2 of amplifier 30 to provide a low impedance drive to node 40. Advantageously, this suppresses changes at node 40 attributable to abrupt output voltage transients being coupled to node 40 via the collector-to-base capacitance of output transistor N4 and so minimizes changes in the magnitude and the recovery time of the driver circuit for the reasons previously discussed in detail with regard to the embodiment of FIG. 4. Selection of the transistor types, relative base-emitter junction areas and the quiescent amplifier current I3 has been previously discussed in detail and so will not be repeated here.

FIGS. 8 and 9 illustrate the performance of the current driver circuit of FIG. 5 as compared with the prior art current driver circuit of FIG. 3. As in the previous examples, the data were produced by computer simulation using Gummel-Poon bipolar transistor models, the input current was selected to be 30 microamperes and the junction area ratio for transistors N1 and N2 was selected to be 5:1 for a current gain of ×5 (times five). The output voltage transient was selected to be 5 to 15 volts with a transition time of 5 nanoseconds.

FIG. 8 shows the comparative results for a low-to-high output voltage transition. As shown, the conventional feedback regulated circuit of FIG. 3 exhibited substantial undershoot and overshoot of output current I2. The overshoot was substantially reduced in the embodiment of FIG. 5 and comparable results were achieved for the undershoot and recovery time. In FIG. 9, which shows comparative results for a high-to-low output voltage transition, the results show a very substantial reduction for both the undershoot and the circuit recovery time. Specifically, the FIG. 5 current was never driven to cut-off during the transient and recovered to its quiescent value in less than 30 nanoseconds whereas the FIG. 3 circuit experienced cut-off and did not recover from the transient within the measurement interval.

Figure 11:
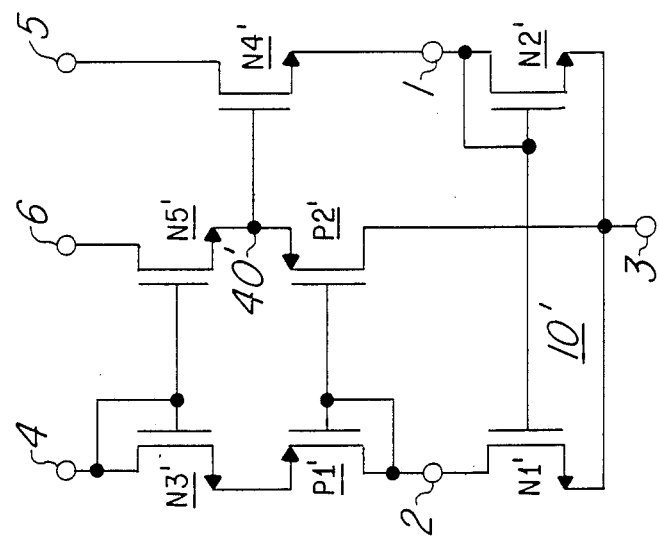
FIGS. 10 and 11 are circuit diagrams illustrating modifications of the circuit diagrams of FIGS. 4 and 5, respectively, for utilizing field-effect transistors in the drive circuits.
Figure 10:
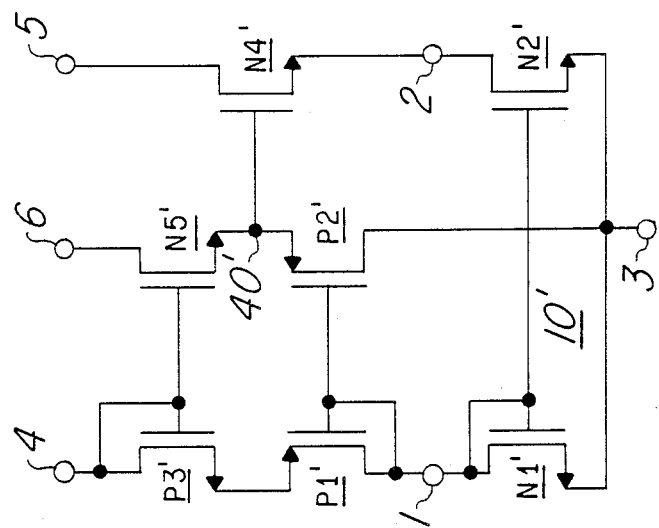

FIGS. 10 and 11 illustrate modifications of the driver circuits of FIGS. 4 and 5. The modifications comprise replacing each NPN transistor with a corresponding N-channel field effect transistor and replacing each PNP transistor with a corresponding P-channel field effect transistor. Although field effect transistors are not subject to base width modulation effects (i.e., the "early" effect) characteristic of bipolar transistors, they nevertheless exhibit drain current variations in response to drain-to-source voltage variations when biased with a constant gate-to-source voltage. Field effect transistors are also characterized by having drain-to-gate and channel-to-gate capacitance effects which can cause transient errors in driver circuit applications analogous to those of the bipolar current drivers discussed in detail herein. Accordingly, the same solution for correcting transient problems in bipolar current drive circuits may be applied to field-effect transistor current drive circuits as shown. Operation of the field effect transistor modified circuits is substantially the same as previously described for the bipolar transistor embodiments and so will not be repeated here.

There have been shown and described current driver circuits in which the circuit sensitivity to abrupt output voltage changes, as hereinbefore defined, has been substantially reduced for driver circuits of both the "feed forward" and the "feedback" regulation types. The disclosed embodiments of current driver circuits are exemplary of the principles of the invention and may be modified in various ways. For example, the current amplifier portion (10) of the overall driver circuit may be replaced with a more complex form of current amplifier. Also additional cascode stages may be added as long as at least one stage includes a threshold conduction device and an auxiliary amplifier connected and providing the equivalent functions of those herein shown and described.

What is claimed is:

1. A constant current drive circuit, comprising:
    a current amplifier having a first terminal coupled via a threshold conduction device to a circuit input terminal and having a second terminal coupled via the conduction path of an output transistor to a circuit output terminal; and
    a bi-directional amplifier coupled to supply a voltage produced by said threshold conduction device to a control electrode of the output transistor for causing an output current to be supplied to said circuit output terminal proportional to an input current supplied to said input terminal, the bi-directional amplifier being biased for continuous conduction of operating current to provide a low impedance node at the control electrode of the output transistor, the bi-directional amplifier further being responsive to transients of either polarity at the control electrode for enhancing the recovery time of the drive circuit for abrupt changes in output voltage at said circuit output terminal.

2. A constant current drive circuit as recited in claim 1 wherein said bi-directional amplifier comprises a unity voltage gain non-inverting amplifier providing an impedance reduction between said threshold conduction device and said output transistor.

3. A constant current drive circuit as recited in claim 1 wherein said bi-directional amplifier comprises a push-pull amplifier having a pair of complementary output transistors biased for continuous conduction of operating current through their respective conduction paths.

4. A constant current drive circuit as recited in claim 1 wherein said threshold conduction devices comprises a first pair of complementary transistors and said bi-directional amplifier comprises a second pair of complementary transistors having conduction paths biased for continuous conduction of operating current by said first pair of complementary transistors.

5. A constant current drive circuit as recited in claim 1 wherein said threshold conduction device comprises a pair of serially coupled complementary semiconductor devices, each semiconductor device being coupled to a respective input of said bi-directional amplifier and being forward biased for conduction of said input current.

6. A constant current drive circuit as recited in claim 1 wherein said threshold conduction device comprises a pair of serially coupled complementary semiconductor devices, said bi-directionally amplifier comprises a pair of complementary transistors, each having a control electrode coupled to a respective one of said complementary semiconductor devices.

7. A constant current drive circuit as recited in claim 1 wherein said first terminal comprises an input terminal of said current amplifier and said second terminal comprises an output terminal of said current amplifier.

8. A constant current drive circuit, comprising:
    a current amplifier having an input terminal coupled via a threshold conduction device to a circuit input terminal and having an output terminal coupled via the conduction path of an output transistor to a circuit output terminal; and
    a bi-directional amplifier coupled between said device and a control electrode of said output transistor for biasing said transistor to produce an output current proportional to an input current supplied to said circuit input terminal, the bi-directional amplifier being biased for continuous conduction of operating current to provide a low impedance node at the control electrode of the output transistor, the bi-directional amplifier further being responsive to transients of either polarity at the control electrode for enhancing the recovery time of said drive circuit for abrupt changes in voltage at said output terminal.

9. A constant current drive circuit as recited in claim 8 wherein said bi-directional amplifier comprises a unity voltage gain non-inverting amplifier providing an impedance reduction between said device and said control electrode of said output transistor.

10. A constant current drive circuit as recited in claim 8 wherein said bi-directional amplifier comprises a push-pull amplifier having a pair of complementary output transistors biased for continuous conduction of operating current through their respective conduction paths.

11. A constant current drive circuit as recited in claim 8 wherein said device comprises a first pair of complementary transistors and said bi-directional amplifier comprises a second pair of complementary transistors having conduction paths thereof biased by said first pair of complementary transistors for continuous conduction of operating current.

12. A constant current drive circuit as recited in claim 8 wherein said device comprises a pair of serially coupled complementary semiconductor devices, each semiconductor device being coupled to a respective input of said bi-directional amplifier.

13. A constant current drive circuit as recited in claim 8 wherein said device comprises a pair of serially coupled complementary semiconductor devices, said bi-directional amplifier comprises a pair of complementary transistors, each having a control electrode coupled to a respective one of said complementary semiconductor devices.

14. A constant current drive circuit, comprising:
a current amplifier having an output terminal coupled via a reference voltage producing device to a circuit input terminal and having an input terminal coupled via the conduction path of an output transistor to a circuit output terminal; and
a bi-directional amplifier coupled between said device and a control electrode of said output transistor for biasing said transistor to produce an output current proportional to an input current supplied to said circuit input terminal, the bi-directional amplifier being biased for continuous conduction of operating current to provide a low impedance node at the control electrode of the output transistor, the bi-directional amplifier further being responsive to transients of either polarity at the control electrode for enhancing the recovery time of said drive circuit for abrupt changes in voltage at said output terminal.

15. A constant current dive circuit as recited in claim 14 wherein said bi-directional amplifier comprises a unity voltage gain non-inverting amplifier providing an impedance reduction between said device and said control electrode of said output transistor.

16. A constant current drive circuit as recited in claim 14 wherein said bi-directional amplifier comprises a push-pull amplifier having a pair of complementary output transistors biased for continuous conduction of operating current through their respective conduction paths.

17. A constant current drive circuit as recited in claim 14 wherein said device comprises a first pair of complementary transistors and said bi-directional amplifier comprises a second pair of complementary transistors having conduction paths biased for continuous conduction of operating current by said first pair of complementary transistors.

18. A constant current drive circuit as recited in claim 14 wherein said device comprises a pair of serially coupled complementary semiconductor devices, each semiconductor device being coupled to a respective input of said bi-directional amplifier.

19. A constant current drive circuit as recited in claim 15 wherein said device comprises a pair of serially coupled complementary semiconductor devices, said bi-directional amplifier comprising a pair of complementary transistors, each having a control electrode coupled to a respective one of said devices.

20. A constant current drive circuit, comprising:
first and second supply voltage terminals;
a drive circuit input terminal for receiving an input current and a drive circuit output terminal for supplying an output current to a load proportional to said input current;
a current mirror amplifier having first and second signal terminals and having a common terminal, said first signal terminal being coupled via a threshold conduction device to said drive circuit input terminal, said second signal terminal being coupled via the conduction path of an output transistor to said drive circuit output terminal; and
a push-pull amplifier having power input terminals connected to said supply voltage terminals, having an input circuit connected to said threshold conduction device and having an output connected to a control electrode of said output transistor for biasing said transistor to produce an output current proportional to said input current and for enhancing the recovery time of said drive circuit for abrupt changes in output voltage at said drive circuit output terminal.

21. A constant current drive circuit as recited in claim 20 wherein said push-pull amplifier comprises a pair of complementary transistors having conduction paths serially coupled between said supply terminals and biased for continuous conduction of operating current through said serially coupled paths by said threshold conduction device.

22. A constant current drive circuit as recited in claim 21 wherein said device comprises a further pair of complementary transistors having conduction paths serially coupled for conducting said input current, each having a control electrode coupled to one end of the conduction path thereof for providing forward bias to said control electrode.

* * * * *